US007129757B2

(12) United States Patent
Geer et al.

(10) Patent No.: US 7,129,757 B2
(45) Date of Patent: Oct. 31, 2006

(54) CLOCK FREQUENCY DETECT WITH PROGRAMMABLE JITTER TOLERANCE

(75) Inventors: Charles Porter Geer, Rochester, MN (US); Robert Allen Shearer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 11/000,439

(22) Filed: Nov. 30, 2004

(65) Prior Publication Data
US 2006/0114032 A1    Jun. 1, 2006

(51) Int. Cl.
*G01R 25/00* (2006.01)
(52) U.S. Cl. .......................................... 327/12; 327/24
(58) Field of Classification Search .................... 327/2, 327/3, 5, 7–9, 12, 24, 146–147, 154–155, 327/162; 331/12, 11, 17, 25, 1 A; 375/375, 375/376
See application file for complete search history.

(56) References Cited

U.S. PATENT DOCUMENTS

| 6,034,554 A | * | 3/2000 | Francis et al. ................. 327/7 |
| 6,392,494 B1 | * | 5/2002 | Takeyabu et al. ............. 331/11 |
| 6,418,502 B1 | | 7/2002 | Larson ....................... 710/306 |
| 7,015,726 B1 | * | 3/2006 | Tayler et al. ................. 327/24 |

* cited by examiner

*Primary Examiner*—Linh My Nguyen
(74) *Attorney, Agent, or Firm*—Robert R. Williams (57) ABSTRACT

An apparatus and method is disclosed for programmable determination of frequency, phase, and jitter relationship of a first clock and a second clock in an electronic system. In a first, initialization, mode, a first register and a second register are initialized with a first bit pattern and a second bit pattern, respectively. In a second, normal, mode, the first clock is coupled to the first register and the second clock is coupled to the second register. A compare unit observes the bit patterns of the first and second registers and reports when one or more predetermined relationships between the first clock and the second clock occur.

1 Claim, 8 Drawing Sheets

CLOCK FREQUENCY DETECT WITH PROGRAMMABLE JITTER TOLERANCE

BACKGROUND OF THE INVENTION

1. Field of the Invention

The current invention generally relates to electronic systems having a plurality of clocks, the clocks having related frequencies. More particularly, the current invention detects if each of the plurality of clocks is operating at a proper speed relative to other clocks in the plurality of clocks, and has phase and jitter characteristics are within predetermined bounds.

2. Description of the Related Art

Electronic systems, such as, for examples, computer systems or components of computer systems, often have a plurality clocks having required relationships between different clocks in the plurality of clocks. For example, an electronic system may have two clocks that must have the same frequency. As another example, the electronic system may have a first clock having a first frequency, and a second clock having a second frequency that is a multiple of the first frequency. For example, in electronic systems having a phase locked loop (PLL), a designer must detect when the PLL has locked onto an oscillator frequency coupled to the PLL.

For example, if two clocks are required to have the same frequency, the designer may have additional requirements as to phase relationships between the two clocks, and may have further requirements as to jitter between the two clocks. The phase and jitter relationships between the two clocks need to be margin tested during system test. Jitter is temporary frequency changes in the first clock relative to the second clock. During system test, stress testing of the phase and jitter relationships should be performed. During normal operation of the electronic system, the frequency, phase, and jitter requirements must be guaranteed. During testing of a prototype electronic system, relaxed tolerance of frequency, phase, and jitter are often allowable, and a programmable test of such relationships is desired.

Existing art, such as U.S. Pat. No. 6,418,502, "AGP Clock Start/Stop Detection Circuit", for example, provide detection that two clocks (i.e., AGP_CLK and STROBE clock) have a proper frequency relationship. However, the existing art does not provide a programmable method and apparatus to provide accommodation for, or stress testing of, phase and jitter relationships between clocks in a plurality of clocks in an electronic system.

Therefore, there is a need for a method and apparatus to provide programmable accommodation for stress testing of phase and jitter relationships between clocks in a plurality of clocks in an electronic system.

SUMMARY OF THE INVENTION

The current invention teaches a structure and method for ascertaining that a first clock and a second clock have frequency, phase, and jitter relationships that comply with predetermined specifications.

In an embodiment, a first register is loaded with a first bit pattern and a second register is loaded with a second bit pattern. The first register is subsequently clocked by the first clock and the second register is subsequently clocked by the second clock. The first register and the second register respond (e.g., increment, decrement, or rotate) to their respective clock inputs. Compare logic determines a non-compliance with frequency, phase, or jitter by detecting a collision between the first bit pattern and the second bit pattern.

In an embodiment, the first clock and the second clock have different frequencies, and the frequency difference is accommodated by providing different number of bits in the first register and the second register.

In an embodiment, the first clock and the second clock have different frequencies, and the frequency difference is accommodated by providing a counter on the clock with the higher frequency.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a programmable structure and method for ascertaining that a first clock and a second clock have frequency, phase, and jitter relationships that comply with predetermined specifications. Embodiments of the current invention's structure and method provide for programmable margin testing of clock frequency, phase, and jitter relationships in an electronic system.

The first clock and the second clock have predetermined frequency requirements, established by a designer of an electronic system. For example, the first clock may have to run at the same frequency as the second clock. As a second example, the first clock may have to be twice, three times, or four times the frequency of the first clock. The present invention contemplates any frequency relationship between the first and the second clock, including noninteger frequency multiples. The first clock and the second clock have predetermined phase requirements, established by a designer of an electronic system. For example, the first clock and the second clock may be expected to have coincident edges in one embodiment. In a second embodiment, the second clock may be expected to be 180 degrees out of phase with the first clock. The first clock and the second clock also have predetermined jitter requirements, established by the designer of the electronic system. For example, it may be acceptable if, over a period of time, the number of cycles of the first clock and of the second clock may differ slightly within limits determined by the designer of the electronic system.

Figure 1:
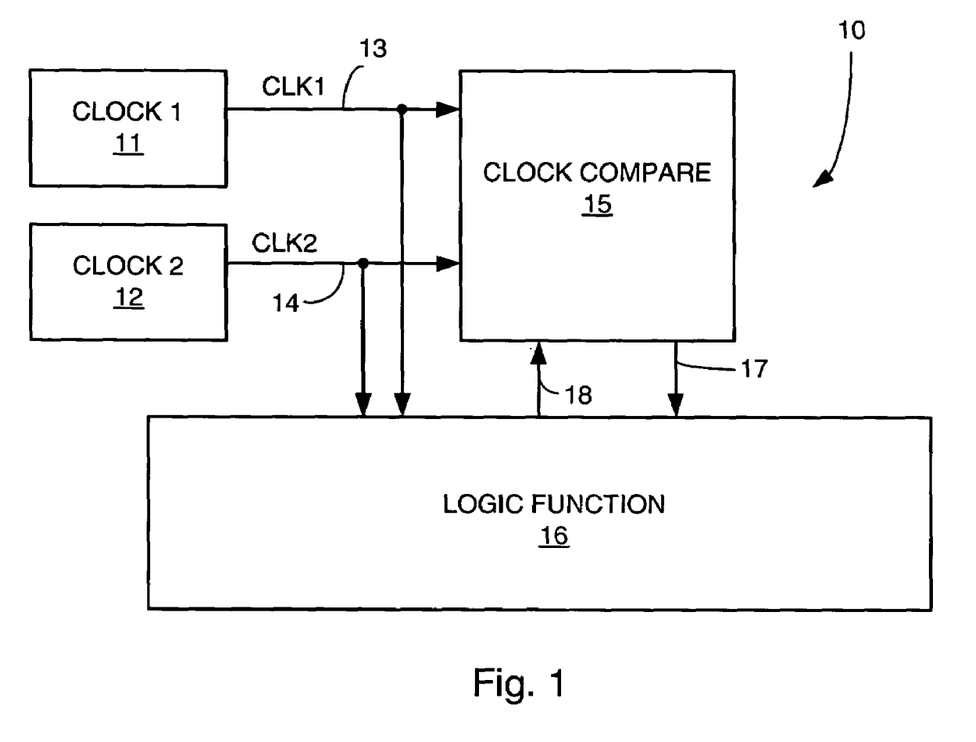
FIG. 1 is a high level block diagram of an electronic system having a plurality of clocks.

Turning now to FIG. 1, an electronic system 10 is illustrated. Electronic system 10 comprises a plurality of clock sources. Clock1 11 and clock2 12 are shown for exemplary purposes as clock sources. Clock source Clock1 11 produces a first clock signal clk1 13; clock source clock2 produces a second clock signal clk2 14. Clk1 13 and clk2 14 are coupled to logic function 16 and to clock compare 15. Logic function 16 uses clk1 13 and clk2 14 as inputs to perform whatever logical operations are designed into logic function 16. For example, logic function 16 can be a processor, an SRAM (Static Random Access Memory), a DRAM (Dynamic Random Access Memory), some or all portions of an ASIC (Application Specific Integrated Circuit) chip, or any other electronic logic function. Clock compare 15 receives clk1 13 and clk2 14. Clock compare 15 also receives one or more signals on control interface 18. In an embodiment, control interface 18 comprises a scan clock and scan data, for example, as well as mode select and tolerance select signals. Clock compare 15 outputs a clock compare output 17. Clock compare output 17 may comprise one or more signals. Clock compare output 17 indicates whether clk1 13 and clk2 14 comply with the frequency, phase, and jitter requirements. Clock compare 17, in embodiments also may contain encoded information as to degree of compliance (such as "almost out of compliance" by some predetermined relationship defined by the designer of electronic system 10). Logic function 16, in various embodiments, responds to a logic signal on clock compare output 17 that indicates that a clock relationship (i.e., frequency, phase, or jitter) is in noncompliance, or nearing noncompliance. Upon receiving a noncompliance logic signal on clock compare output 17, logic function 16 may report the noncompliance to an operator, halt operations in logic function 16 until compliance is regained, or even shut off power to electronic system 10. For example, clock compare 15 can be used to verify that a PLL (Phase Locked Loop) circuit has locked on to an incoming signal. In such a case, clk1 13 is the incoming oscillator signal and clk2 14 is the output of the PLL.

Figure 2:
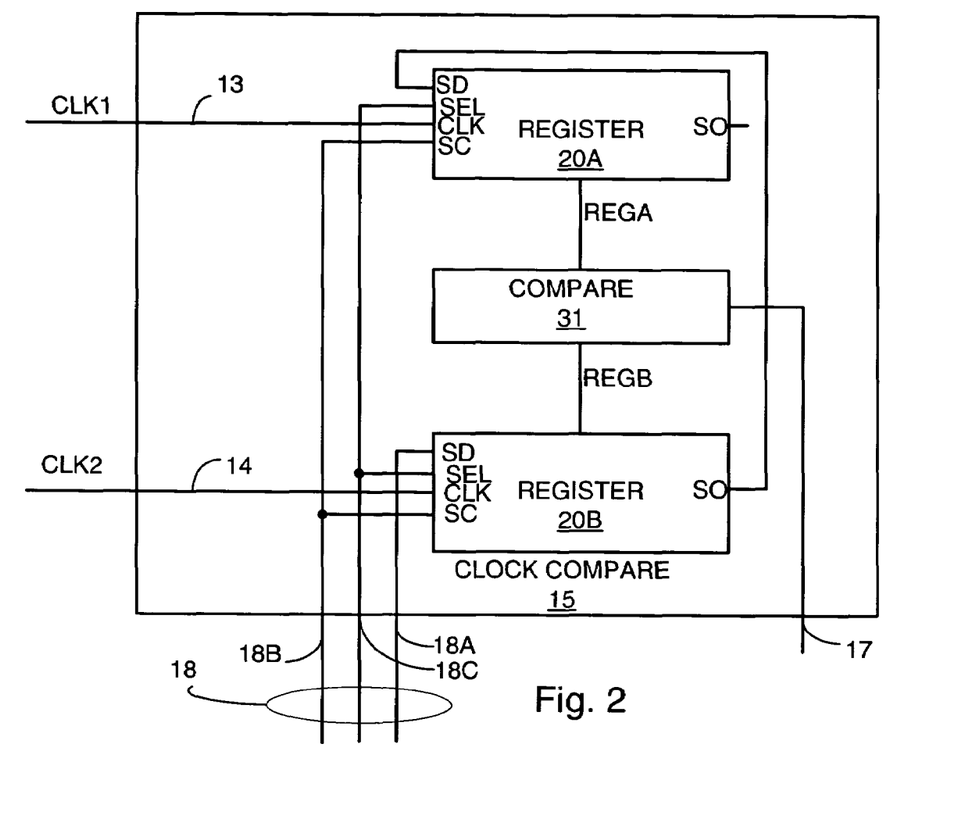
FIG. 2 is a block diagram showing more detail of a clock compare block of FIG. 1.

FIG. 2 shows an exemplary embodiment of clock compare 15. Register 20A and register 20B are clocked by clk1 13 and clk2 14 in normal operation of electronic system 10 (FIG. 1) (i.e., electronic system 10 is not in an initialization mode). Registers 20A, 20B are coupled via signals REGA and REGB to compare 31, which drives clock compare output 17 responsive to a comparison of a first content (value) in register 20A (REGA) and a second content (value) in register 20B (REGB). Logic function 16, via control interface 18, is capable of loading registers 20A, 20B with patterns of "1"s and "0"s as will be described shortly. Control interface 18 is shown in FIG. 2 as having a scan data 18A, a scan clock 18B, and a mode select 18C. Those skilled in the art will understand that there are numerous ways that logic function 16 can write bit patterns into registers 20A, 20B, and the embodiment shown in FIG. 2 is exemplary only.

Figure 3A:
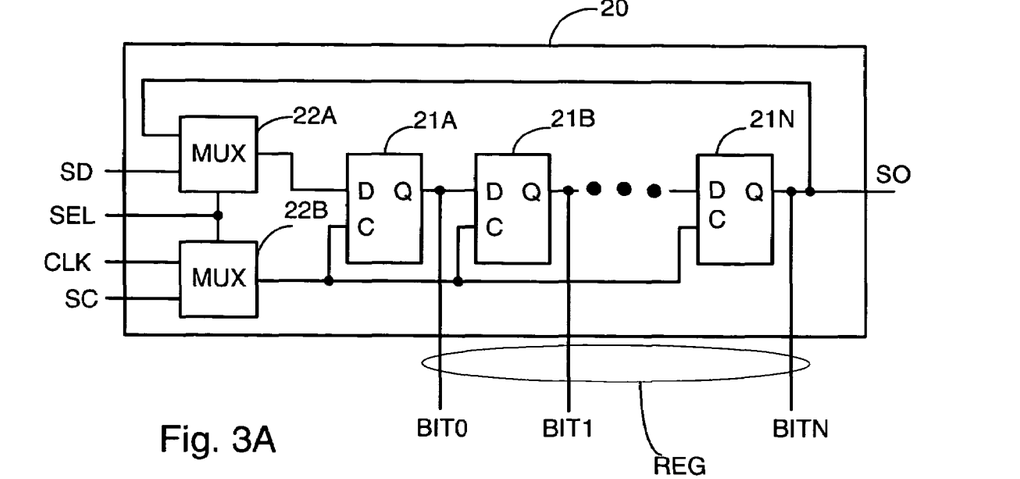
FIGS. 3A–3C show detailed block diagrams of embodiments of a register shown in FIG. 2.

FIG. 3A shows a first embodiment of a register 20 suitable for instantiation as register 20A and/or Register 20B. Register 20 comprises a plurality of latches 21A–21N. Any number of latches in register 20 is contemplated. It will be understood that an instantiation of register 20 in register 20A may differ in number of latches from an instantiation of register 20 in register 20B. Outputs Bit0-BitN together comprises REGB when register 20 is instantiated as register 20B, and REGA when register 20 is instantiated as register 20A. Register 20 further comprises multiplexers 22A, 22B. Bit0 is coupled to an output of latch 21A; bit2 is coupled to an output of latch 21B, and so on as shown. BitN is further used as a scan out signal from register 20, as shown. Register 20 receives a CLK clock input and a SC (scan clock) input into multiplexer 22B. Multiplexer 22A receives BitN and SD (scan data). Multiplexers 22A, 22B also receive a SEL signal. Multiplexer 22A passes the value of BitN to latch 21A as data input when SEL is "1" and passes the value of SD to latch 21A as data when SEL is "0". Similarly, multiplexer 22B passes the value of CLK as a clock input to latches 21A–21N when SEL is "1" and passes the value of SC to latches 21A–21N when SEL is "0".

In instantiations of register 20 as register 20A, 20B in FIG. 2, clk1 13 is coupled to the CLK input of register 20A; clk2 14 is coupled to the CLK input of register 20B. Scan clock 18B is coupled to the SC inputs of registers 20A, 20B. The SD input of register 20B is coupled to scan data 18A. The SO (scan out) output of register 20B is coupled to the SD input of register 20A. Mode select 18C is coupled to the SEL inputs of registers 20A, 20B. When mode select 18C is "0" (initialization mode) scan clock 18B is coupled to all latches. In initialization mode, scan data on 18A is shifted, responsive to the scan clock, through register 20B and through register 20A (since the SD input of register 20A is coupled to BitN (SO) of register 20B. In this manner, logic function 16 (FIG. 1) can write any arbitrary pattern of "1"s and "0"s into registers 20A, 20B. It will be understood that the invention is not limited to the mechanism for writing patterns just described. Other mechanisms, such as programmable use of "set" and "reset" inputs on embodiments having latches with such inputs are contemplated, as well as broadside (i.e., not scanned) writing, are contemplated.

Figure 3B:
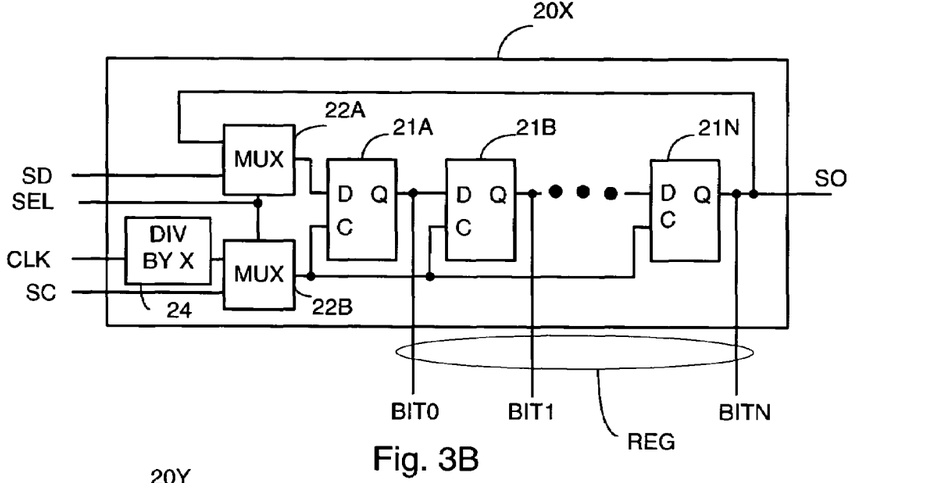

FIG. 3B shows a variation of the register embodiment of FIG. 3A. Register 20X is similar to register 20, with the addition of a divide by X circuit 24 coupled between clock input CLK and multiplexer 22B. Note that similar blocks in register 20 and register 20X have the same reference numerals. The purpose of divide by X circuit 24 is to divide the incoming clock frequency by some value, "X", in order to reduce a required number of latches in an instantiation of register 20 that would otherwise be required as will be explained below. Division by any value is contemplated. Furthermore, instantiations of register 20X are contemplated for register 20A having a first division value and for register 20B having a second division value, the first division value being different from the second division value.

Figure 3C:
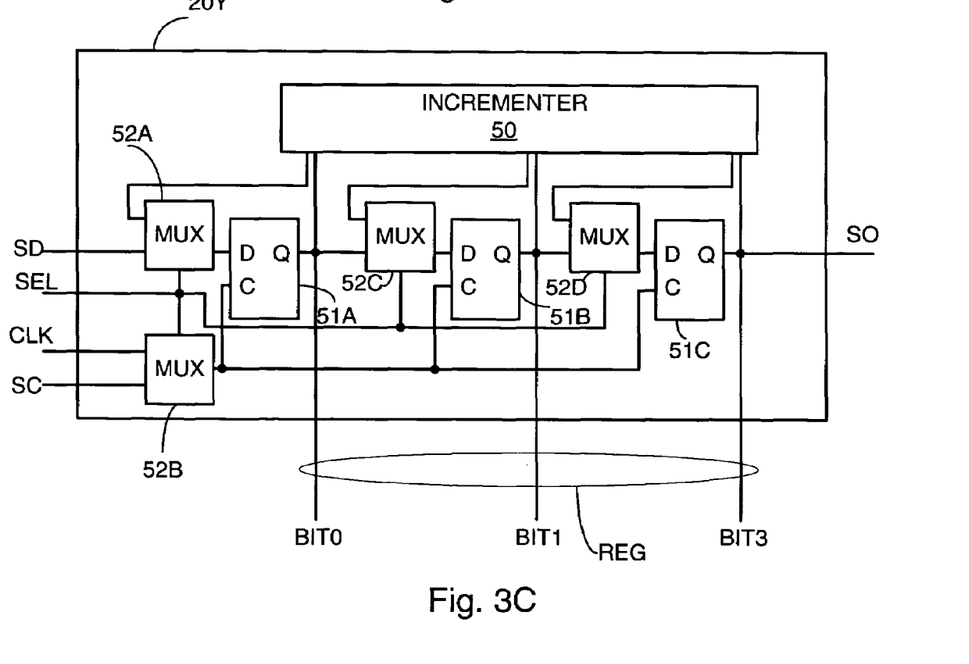

FIG. 3C shows another register embodiment. Although simple shift registers as described above are used in embodiments of the invention, in another embodiment, incrementing registers, as illustrated in FIG. 3C can be used. Register 20Y shown in FIG. 3C has a plurality of latches 51A–51C (although any number of latches is contemplated). As with registers 20 and 20X, an instantiation of register 30Y latches 51A–51C can be written (initialized) using a control interface 18 (FIG. 2) comprising a scan clock (coupled to SC), a scan data (coupled to SD). A mode select is coupled to SEL to set the mode to a normal mode in which register 20Y increments, using incrementer 50, or is initialized via the control interface 18. As shown, multiplexers 52A, 52C, 52D select a data source (i.e., incrementer 50 outputs or scan data, responsive to SEL). Multiplexer 52B selects CLK (which is coupled to clk1 13 or clk2 14) or SC (scan clock) responsive to SEL. In an embodiment, incrementer 50, in normal mode, simply provides data at latch (i.e., 51A–51C) inputs such that the register increments responsive to the clock "C" inputs on the latches. A decrementing embodiment of register 20Y is contemplated (i.e., increment by a negative number).

For exemplary purposes, a simple clocking situation is described using Table 1 below. Registers 20A, 20B are each an eight bit instantiation of register 20. CLK1 13 and CLK2 14 are operating at the same frequency and phase, with no jitter. Registers 20A, 20B each have been initialized with a single "1". Register 20A has been initialized with its single "1" in bit0; register 20B has been initialized with its single "1" in bit4. Therefore the "1" bits in the two registers are separated by three "0" bits, including the "wrap around" from bit7 (the last bit) to bit0. Table 1 shows the values in register 2A (REGA) and register 20B (REGB) as clocking occurs during normal mode (i.e., mode select 18C is "1". See FIG. 2 where mode select 18C is illustrated). Each successive row in the table shows the bit position in register 20A (REGA) and register 20B (REGB) as clocking occurs.

TABLE 1

| REGA | REGB |
|---|---|
| 10000000 | 00001000 |
| 01000000 | 00000100 |
| 00100000 | 00000010 |
| 00010000 | 00000001 |
| 00001000 | 10000000 |
| 00000100 | 01000000 |
| 00000010 | 00100000 |
| 00000001 | 00010000 |
| 10000000 | 00001000 |

Note that, in the ideal case illustrated in Table 1 (perfect frequency matching, no phase difference, no jitter) that the "1" bits in registers 20A, 20B are always separated by three "0" bits. Thus, if the designer of electronic system 10 (FIG. 1) were to require perfect frequency matching, no phase difference, and no jitter, the designer would design compare 31 to produce a signal on clock compare output 17 that would be asserted at any time at which there is less than three "0" bits of separation.

Table 2 shows a situation where a phase difference in clk1 13 and clk2 14 exists. The bits in register 20A, 20B shift at the same frequency but at different times. I.e., first a bit in register 20A shifts, then a bit in register 20B shifts. Compare 31, to accommodate the acceptable bit pattern illustrated in Table 2, would assert an active signal on clock compare output 17 if the "1" bits in registers 20A, 20B have less than two "0" bits between them.

TABLE 2

| REGA | REGB |
|---|---|
| 10000000 | 00001000 |
| 01000000 | 00001000 |
| 01000000 | 00000100 |
| 00100000 | 00000100 |
| 00100000 | 00000010 |
| 00010000 | 00000010 |
| 00010000 | 00000001 |
| 00001000 | 00000001 |
| 00001000 | 10000000 |
| 00000100 | 10000000 |
| 00000100 | 01000000 |
| 00000010 | 01000000 |
| 00000010 | 00100000 |
| 00000001 | 00100000 |
| 00000001 | 00010000 |
| 10000000 | 00010000 |
| 10000000 | 00001000 |

Table 3 shows an example of how phase difference and jitter can cause the "1" bits of register 20A, 20B (REGA, REGB) to approach each other. Register 20A is initialized "1000000"; register 20B is initialized to "00001000". Note that at one point in time, REGA="00010000" and REGB="00001000", that is, a "1" exists in a particular in register 20A and a "1" exists in an adjacent bit position in register 20B.

TABLE 3

| REGA | REGB |
|---|---|
| 10000000 | 00001000 |
| 01000000 | 00001000 |
| 01000000 | 00001000 |
| 00100000 | 00001000 |
| 00010000 | 00001000 |
| 00010000 | 00000100 |
| 00010000 | 00000010 |
| 00001000 | 00000001 |
| 00001000 | 10000000 |
| 00000100 | 10000000 |
| 00000100 | 01000000 |
| 00000010 | 01000000 |
| 00000010 | 00100000 |
| 00000001 | 00100000 |
| 00000001 | 00010000 |
| 10000000 | 00010000 |
| 10000000 | 00001000 |

Figure 4A:
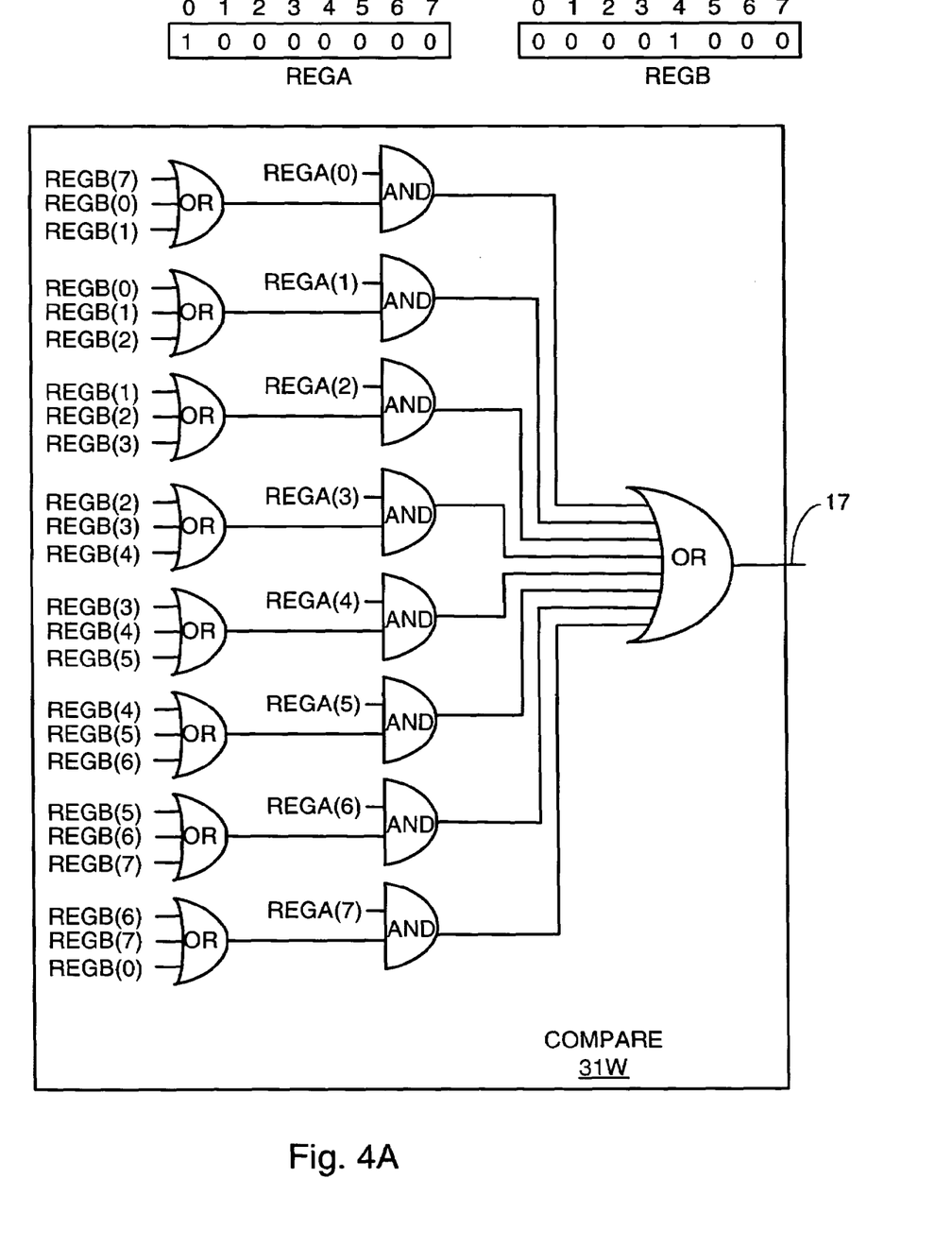
FIGS. 4A–4F show block diagrams of embodiments of a compare block shown in FIG. 2.

The logic shown in FIG. 4A for compare 31W ("W", "X", "Y", "Z", and "S" suffixes will be used to distinguish various embodiments of compare 31) will detect a condition where a "1" bit in register 20A is one bit position (or less) away from a "1" bit in register 20B. A designer of an electronic system typically needs to be able to measure the amount of phase and jitter that occurs in electronic system 10, and provide predetermined action(s) to take if the phase and jitter exceed limits specified by the designer.

Figure 4B:
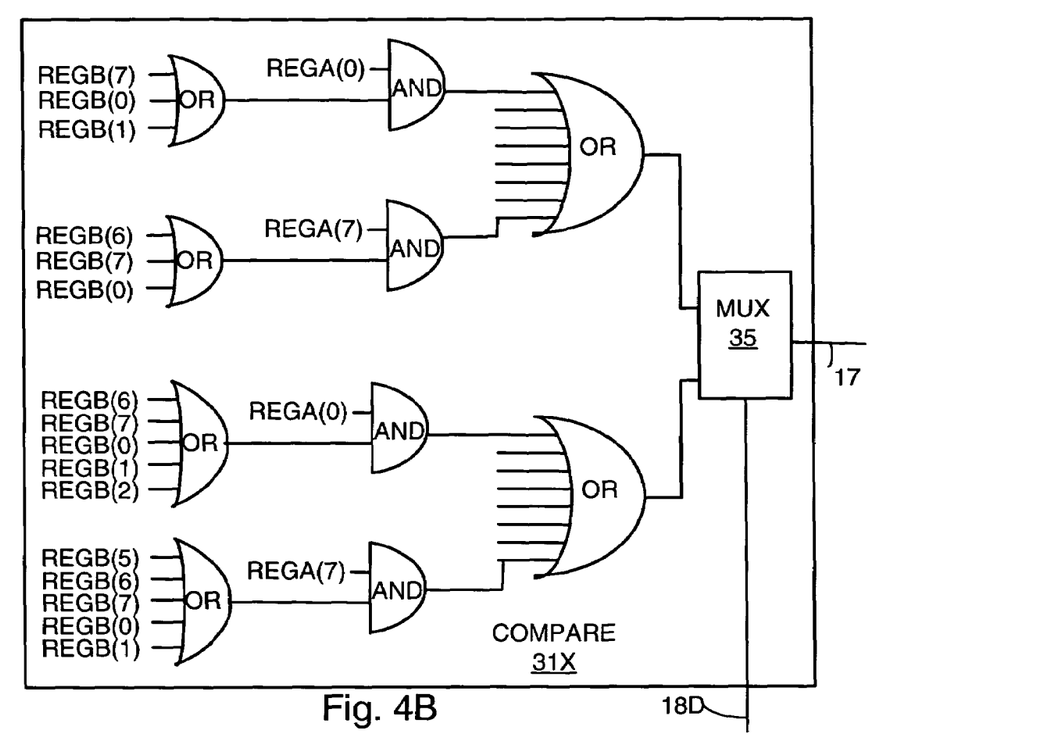

FIG. 4B shows compare 31X, an embodiment of compare 31, capable of detecting either a single bit position (or less) difference in where the "1" bits are in registers 20A, 20B, or two bit positions (or less) difference in where the "1" bits are in interface 20A, 20B, selected by a tolerance control 18D signal (a signal in control interface 18 seen in FIG. 2) provided by logic function 16 to multiplexer 35. Note that the six inputs of both eight-way ORs in FIG. 5A that are not shown to be connected are connected to OR/AND logic similar to the two inputs of the eight-way ORs that are connected. The simplification has been made for brevity of illustration.

Figure 4C:
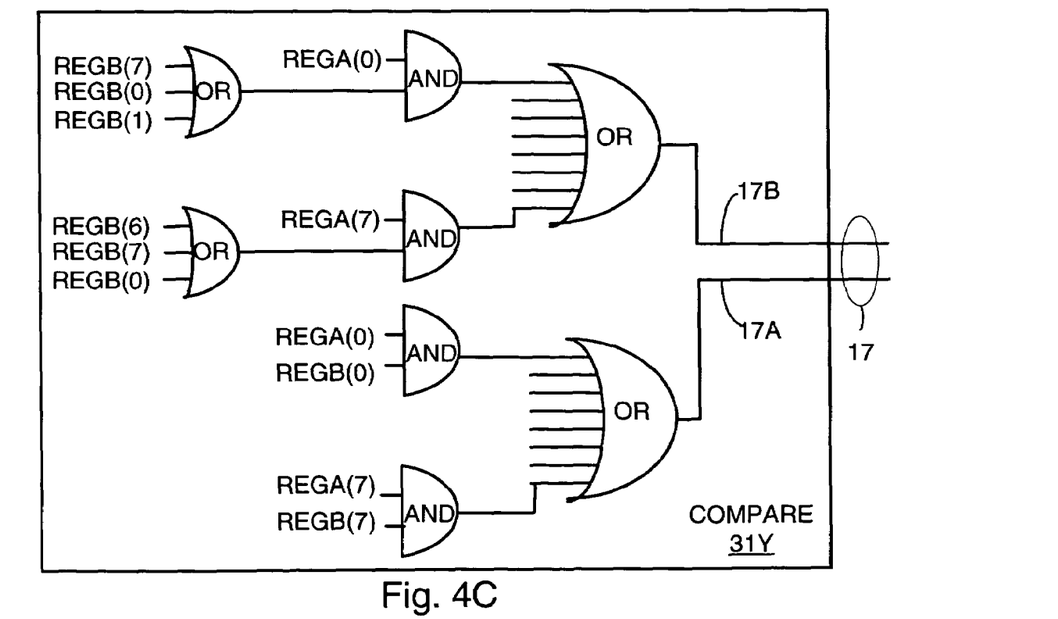

FIG. 4C shows compare 31Y, an embodiment of compare 31 that outputs clock compare output 17 as a plurality of signals 17A and 17B encoded to convey information as to a degree of collision. The designer of electronic system 10 establishes predetermined frequency, phase, and jitter relationships between clk1 13 and clk2 14 that should be observed by an embodiment of compare 31. "Collision" simply means that one or more of the predetermined relationships is detected by an embodiment of compare 31. For example, in an embodiment, a collision means that a "1" bit in a particular bit position in register 20A is in the same particular bit position in register 20 B, or in a nearby bit position in register 20B. A designer of electronic system 10 may require information regarding how close are the "1" bits in the bit pattern in register 20A versus the "1" bits in the bit pattern in register 20B. Clock compare signal 17A is activated when a "1" in a particular bit position or register 20A is in the same particular bit position of register 20B. Clock compare signal 17B is activated when a "1" in a particular bit position in register 20A is at the same bit position, or within a single bit position, of a "1" in register 20B. It will be appreciated that suitable logic arrangements will provide other useful information encoded onto a clock compare output 17 having a plurality of bits. For example, an encoded clock compare output 17 in an embodiment, a "11" on a two bit clock compare output 17 indicates that a "1" bit is in the same bit position in register 20A and register 20B. A "10" indicates that a "1" bit in register 20A has a "1" bit one position to its right in register 20B. A "01" indicates that a "1" bit in register 20A has a "1" bit one position to its left in register 20B. Any number of signals in clock compare output 17 is contemplated, with any relationship between the bit patterns in register 20A and register 20B encoded thereon.

Figure 4D:
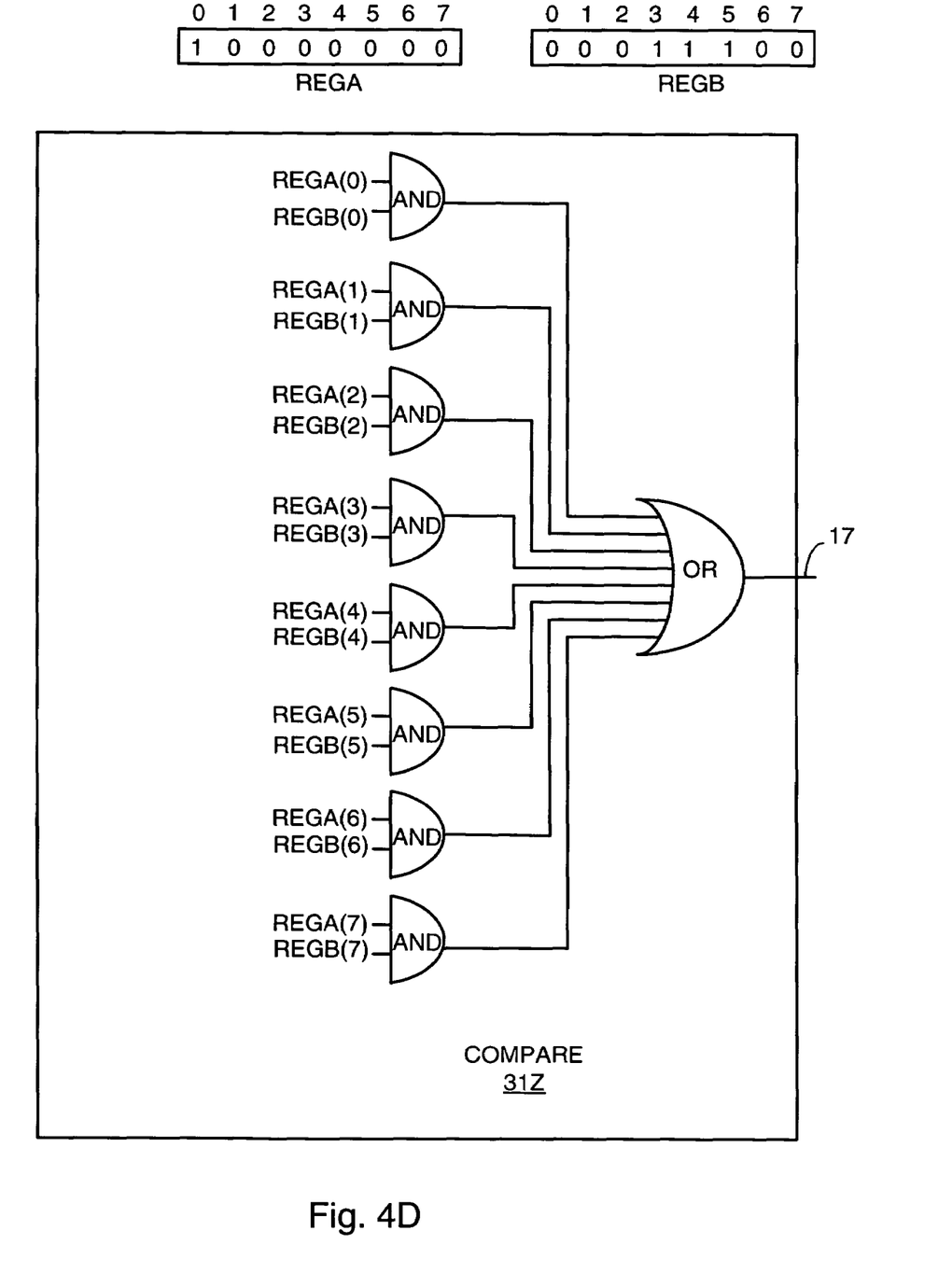

FIG. 4D shows compare 31Z, another embodiment of compare 31. Logic in compare 31Z is simpler than logic in compare 31W, 31X, and 31Y, while still offering complete programmability of detection. Clock compare output 17 is only asserted if both a particular bit position in register 20A and the same bit position in register 20B are both "1". Selectable tolerance is achieved by scanning in (or otherwise setting) a plurality of bits in register 20A, register 20B, or both. An exemplary initial bit pattern (i.e., as scanned in during mode select) for register 20A (REGA) and register 20B (REGB) is shown in FIG. 4D: register 20A="10000000"; register 20B="00011100". With the logic shown in FIG. 4D, enough phase and/or jitter to shift the bit pattern initialized in register 20B three bit positions relative to the bit pattern initialized in register 20A three bit positions will cause clock compare output 17 to be asserted.

Continuing with the description of compare 31Z, if register 20A is initialized to "10000000" and register 20B is initialized to "00001000", four bit positions of phase and/or jitter will cause clock control output 17 to be asserted. Less than a four bit position shift will leave clock control output 17 to be not asserted.

As another example of the embodiment of compare 31Z, if register 20A is initialized to "10000000" and register 20B is initialized to "01111111", any phase or jitter will cause compare clock output 17 to be asserted. That is, if the bits of register 20A shift even one bit position relative to register 20B, clock compare output 17 will be asserted.

Compare 31Z, as do the other embodiments of compare 31, is easily adaptable to providing encoded information as to noncompliance with frequency, phase, and jitter requirements, or how closely clk1 13 and clk2 14 are to noncompliance. Additional logic (not shown in FIG. 4D) similar to that shown in FIGS. 4B, 4C, would be required to provide information on degree of collision. Of course, similar information on degree of collision can be achieved using compare 31Z as shown in FIG. 4D by re-initializing registers 20A, 20B with more or less "1"s, however, such an approach does require the re-initialization.

In some electronic systems, clk1 13 may be allowed to temporarily "gain" on clk2 14. This is easily accommodated by the present invention, again with readily programmable degrees of how much "gain" will be tolerated before compare clock output 17 is asserted. For example, again using the embodiment of compare 31 shown in FIG. 6, if register 20A is initialized to "10000000" and register 20B is initialized to "00000001", clk1 13 can shift seven bits forward relative to clk2 14 before clock compare output 17 is asserted, but cannot shift backwards at all before clock compare output 17 is asserted. It is understood that scanning in a bit pattern having more than a single "1" is equally applicable to compares 31W, 31X, 31Y to further program detection of predetermined relationships of frequency, phase and jitter between clk1 13 and clk2 14.

It will be appreciated that large amounts of jitter can be accommodated by having a large number of latches in registers 20A, 20B, and a suitable compare 31. For example, if registers 20A, 20B each have 64 bits and register 20A is initialized with a leading (i.e., bit0) "1" bit, and register 20B is initialized with a "1" bit in bit position 31, then a 32 bit position shift could be tolerated. By initializing register 20A and/or register 20B as taught earlier with more than a single "1" bit, the designer of the electronic system has the capability of programming a wide range of jitter tolerance when electronic system 10 (FIG. 1) is constructed with registers 20A, 20B having a large number of latches.

Often, the designer of the electronic system must consider a plurality of clocks having different frequencies, with required frequency, phase, and jitter relationships between the clocks. Embodiments of the present invention readily accommodate such requirements.

Consider an electronic system having clk1 13 having a first frequency, "F", and clk2 14 having a frequency "2*F". Register 20A (FIG. 2) is instantiated with register 20 as shown in FIG. 3A having N+1 latches. Register 20B (FIG. 2) is instantiated with register 20X as shown in FIG. 3A also having N+1 latches (i.e., the same number of latches as register 20A). Register 20B divides clk2 14 by two, using the divide by X 24 block shown in FIG. 3B, where divide by X 24 is instantiated to divide by two. Therefore, the frequency of clocks received by latches 21A–21N in register 20B is "F", just as the frequency of clocks received by latches 21A–21N in register 20A. As another example, an electronic system has clk1 13 having a first frequency "3*F" and clk2 14 having a second frequency "7*F". Register 20A (FIG. 2) is instantiated with register 20X as shown in FIG. 3A with a divide by three instantiation of divide by X 24 (FIG. 3B); register 20B is instantiated with register 20X with a divide by seven instantiation of divide by X 24. Any clock frequency ratio can be accommodated using instantiations of register 20X having suitable divide by X 24 instantiations.

In an alternative embodiment of the present invention to accommodate frequency differences, while maintaining all the advantages described above, is to instantiate register 20 (FIG. 3) into both register 20A and register 20B, but instantiated with different numbers of latches. For example, if clk1 13 has a frequency of "F", and clk2 14 has a frequency of "2*F", register 20B would be instantiated with twice the number of latches as the instantiation of register 20A. E.g., if register 20A were instantiated using register 20 with eight latches, register 20B would be instantiated with 16 latches. In the normal mode, after eight cycles of clk1 13, register 20A will have rotated once, with the "1" being in the same bit position as prior to the eight cycles of clk1 13. During the same time interval, clk2 14 will have had 16 cycles, and the "1" in register 20B will also be in the same bit position as prior to the 16 cycles of clk2 14. In this alternative embodiment, any frequency ratio between clk1 13 and clk2 14 can be accommodated, given a large enough number of latches in registers 20A, 20B. For example, if clk2 14 has a frequency five times that of clk1 13, then register 20B would be instantiated with five times the number of latches that register 20A is instantiated with. For another example, if clk2 14 has 2.5 times the frequency of clk1 13, a twenty latch instantiation of register 20 for register 20B and an eight latch instantiation of register 20 for register 20A would be implemented. As before, using a programmable compare 31 (e.g., compare 31X of FIG. 5) and/or appropriate scan patterns (as taught earlier in the discussion of compare 31Z of FIG. 6) provide a programmable tolerance of varying amounts of phase and/or jitter.

Figure 4E:
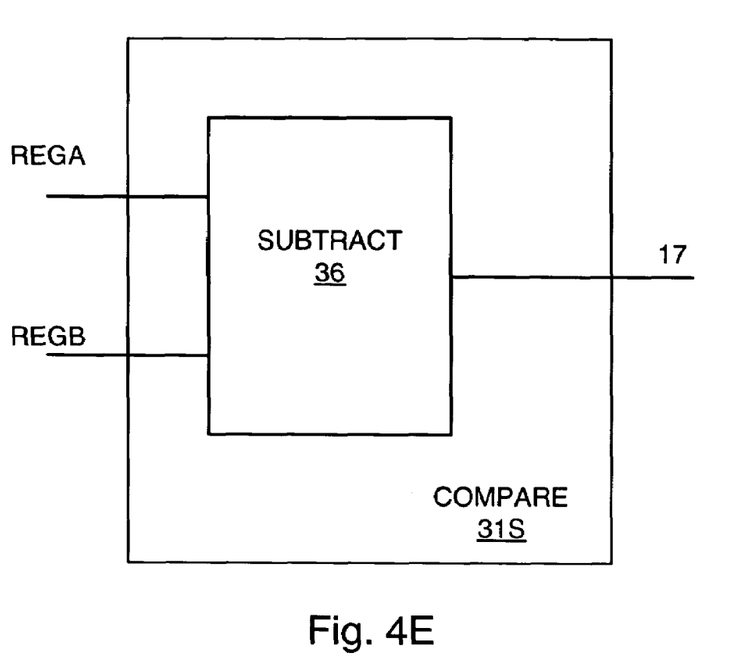

FIG. 4E illustrates a compare 31S, an embodiment of the invention suitable for use in concert with instantiations of register 20Y (FIG. 3C). In contrast with the shift register embodiments described above, compare 31S is coupled to REGA and REGB and computes a difference using subtract unit 36. The difference provides a measure of how much register 20A (REGA) has advanced in count relative to register 20B (REGB). For example, register 20A, 20B are both initialized to "000" (using three bit instantiations of register 20Y). Registers 20A, 20B each increment (in normal mode) responsive to clk1 13 and clk2 14, respectively. If clk1 13 and clk2 14 are identical in all respects (frequency, phase, and jitter), compare 31S will always drive "000" on clock compare output 17 since register 20A will always have the same value as register 20B. If clk1 13 gains two clock pulses relative to clk2 14, compare 31S will drive a "010" on compare output 17. Logic function 16 therefore has complete information on clock frequency, phase, and jitter relationships between clk1 13 and clk2 14.

Figure 4F:
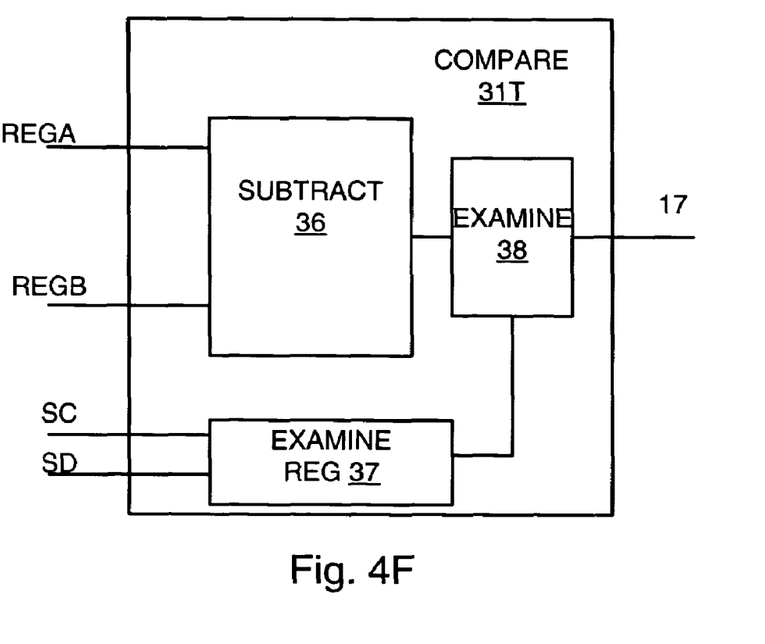

FIG. 4F shows embodiment compare 31T of compare 31. Compare 31T, like compare 31S, is suitable for use with instantiations of register 20Y. Compare 31T comprises subtract unit 36, which produces a difference between REGA and REGB as described in the discussion of compare 31S. Compare 31T is coupled to examine unit 38. An examine register 37 is written by logic function 16 by way of control interface 18. For example, SC (scan clock) and SD (scan data) is coupled to scan data 18A and scan clock 18B in control interface 18 and suitable content (values) are scanned into examine register 37 from logic function 16 similar to the procedure explained earlier for scanning values into register 20. Examine register 37 is loaded with an examine register content that is a difference between REGA and REGB that can be tolerated before clock control output 17 is asserted. For example, if REGA and REGB cannot differ by more than two, examine register is loaded with an examine register content of "010" (assuming that registers 20A, 20B are instantiated with three bit implementations of register 20Y (FIG. 3C). Examine unit 38 asserts clock control 17 if REGA differs (absolute value) from REGB by more than the examine register content ("010") of examine register 37.

It will be understood that although two clocks (i.e., clk1 13 and clk2 14) have been used for illustrative purposes, any number of clocks are contemplated.

Figure 5:
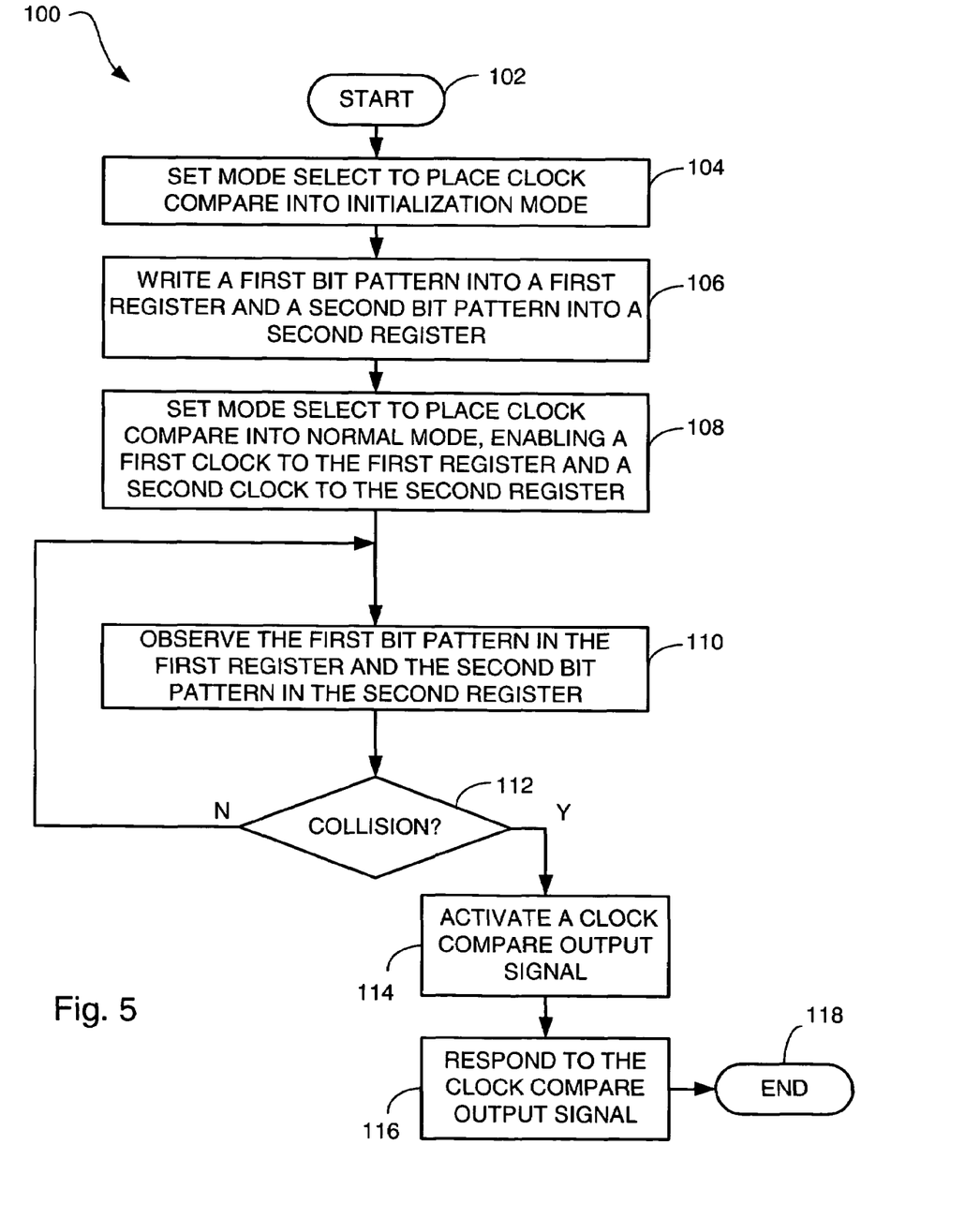
FIG. 5 is a flowchart of a method embodiment of the invention.

Embodiments of the invention can also be described as a method. FIG. 8 shows a flow chart illustrating a method 100 for ensuring that a first clock and a second clock maintain predetermined frequency, phase, and jitter relationships.

Method 100 begins at step 102. In step 104, a mode select is set to an initialization mode, allowing a logic function to write bit patterns into a first register and a second register in a clock compare. The mode select being set to the initialization mode prevents the first clock and the second clock from clocking the first register and the second register.

In step 106, a first bit pattern is written into the first register and a second bit pattern is written into the second register. In an embodiment, the first bit pattern and the second bit pattern are scanned into the first register and the second register, respectively, using a scan clock and scan data provided by the logic function. In a second embodiment, the first bit pattern and the second bit pattern are written in parallel into the first register and the second register, respectively. In a third embodiment, the first register and the second register are comprised of latches having set and reset inputs, and the logic function controls the set and the reset inputs of each latch in the first register and the second register to write the first bit pattern and the second bit pattern.

In step 108, the mode select is set to a normal mode, in which the first clock and the second clock are gated to the first register and to the second register, respectively. In the normal mode, the first register and the second register are each configured as shift registers, with the output of a last latch in each respective register coupled to a first latch in each respective register. In other words the first register and the second register each rotate a bit pattern therein responsive to each cycle of a clock coupled to each respective register. It will be understood that the invention is not limited to embodiments of registers wherein the registers are shift registers; in particular, incrementer (or decrementer) embodiments were described earlier.

In step 110, logic in a compare unit observes the first register and the second register, looking for one or more predetermined relationships between a first content of the first register and a second content of the second register to be satisfied. Satisfaction of the one or more predetermined relationships is called a collision. The designer of the electronic system specifies the one or more predetermined relationships for the electronic system. For example, the logic in the compare unit compares the first bit pattern and the second bit pattern as the first bit pattern rotates in the first register, and as the second bit pattern rotates in the second register. The logic in the compare watches for a collision between "1" bits in the first bit pattern and "1" bits in the second bit pattern. A collision occurs when a "1" bit in a particular bit position of the first bit pattern is within a predetermined number of bit positions of a "1" bit in the second bit pattern.

Step 112 transfers control respondent to detection of a collision (i.e., satisfies one or more of the predetermined relationships). If no collision is detected, control transfers back to step 110 and further observation of the first bit pattern in the first register and of the second bit pattern in the second register is performed. If a collision is detected, control passes to step 114, which activates a clock compare output signal. In an embodiment, the clock compare output signal is a single signal which, e.g., is set to "1" if a collision has been detected. In a second embodiment, clock compare output signal is a plurality of signals encoded to convey a degree of collision. For example, if the collision is a "1" bit in the first bit pattern in the same bit position in the first register as a "1" bit in the same bit position in the second register, a "11" is output on a two bit clock compare output signal. If the collision is a "1" bit in the first bit pattern being a single bit position to the left of a "1" bit in the second bit pattern, a "10" is output on the two bit clock compare output signal. If the collision is a "1" bit in the first bit pattern being a single bit position to the right of a "1" bit in the second bit pattern, a "01" is output on the two bit clock compare output signal. In an alternate embodiment, "11" indicates that a "1" in the first register is in the same bit position as a "1" in the second register; "01" indicates that a "1" bit in the first register is only a single bit position different than a "1" in the second register; and "10" indicates that a "1" bit in the first register is two bit positions different than a "1" in the second register. Any encoded value on a plurality of signals making up the clock compare output indicating degree of collision is contemplated.

In step 116, the logic function responds to the clock compare output signal. The response can be any suitable action that the designer of the electronic system requires. For example, in an electronic system having a PLL (Phase Locked Loop), an active signal on the clock compare output signal may mean that the PLL has not yet achieved lock, and more time is required to wait for a lock. In the electronic system having the PLL, an active signal on the clock compare output signal may mean that the PLL has lost lock and that the electronic system must power down (or be halted until lock is regained). In an embodiment, an active signal on the clock compare output signal alerts an operator of the electronic system. In an embodiment in which the clock compare output signal has made up of more than one signal conductor, the clock compare output carries an encoded signal, a "10" or "01" (as described above) may mean that a PLL (e.g.,) is about to gain lock (or lose lock), and an action predetermined by the designer of the electronic system is performed, whereas a "11" signal may mean that the PLL has not attained (or has lost) lock, and a different action must be performed, such as shutting the electronic system down. In the embodiment of method 100 illustrated, after the logic function responds to the clock compare output signal, control passes to step 118 which ends the method.

What is claimed is:

1. An electronic system comprising:
   a first clock having a first frequency;
   a second clock having a second frequency
   a clock comparator coupled to the first clock and the second clock, the clock comparator is programmable to compare one or more relationships between the first clock and the second clock;
   a first register having a first number of latches, the first register configured to be incremented by the first clock in a normal mode, the first register configured to receive a first bit pattern written therein in an initialization mode;
   a second register having a second number of latches, the second register configured to be incremented by the second clock in the normal mode, the second register configured to receive a second bit pattern written therein in the initialization mode;
   a comparator that is coupled to the first register and to the second register and is configured to compare a first content of the first register with a second content in the second register, the comparator using a subtract unit configured to determine a difference between the first content in the first register and the second content in the second register, and is configured to output a clock compare output value responsive to the compare;
   an examine register configured to be loaded with an examine register content; and
   an examine unit coupled to the subtract unit and the examine register, the examine unit configured to assert one or more signals on the clock control output responsive to an output of the subtract unit and the examine register content.

* * * * *